(12) United States Patent
Hosobuchi et al.

(10) Patent No.: US 11,380,515 B2
(45) Date of Patent: Jul. 5, 2022

(54) CHARGED PARTICLE BEAM DEVICE

(71) Applicant: Hitachi High-Tech Corporation, Tokyo (JP)

(72) Inventors: Keiichiro Hosobuchi, Tokyo (JP); Masaki Mizuochi, Tokyo (JP); Shuichi Nakagawa, Tokyo (JP); Tomotaka Shibazaki, Tokyo (JP); Takaaki Kikuchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/922,552

(22) Filed: Jul. 7, 2020

(65) Prior Publication Data

US 2021/0066025 A1 Mar. 4, 2021

(30) Foreign Application Priority Data

Sep. 3, 2019 (JP) .............................. JP2019-160034

(51) Int. Cl.
*H01J 37/16* (2006.01)
*H01J 37/18* (2006.01)
(Continued)

(52) U.S. Cl.
CPC .......... *H01J 37/22* (2013.01); *H01J 37/1472* (2013.01); *H01J 37/16* (2013.01); *H01J 37/18* (2013.01);
(Continued)

(58) Field of Classification Search
CPC .......... H01J 37/16; H01J 37/18; H01J 37/185; H01J 37/28
See application file for complete search history.

(56) References Cited

U.S. PATENT DOCUMENTS 9,640,364 B2 5/2017 Notte, IV et al.
10,037,864 B2 7/2018 Van Veen et al.
(Continued)

FOREIGN PATENT DOCUMENTS

CN 104798173 A 7/2015
CN 105190824 A 12/2015
(Continued)

OTHER PUBLICATIONS

Taiwanese-language Office Action issued in Taiwanese Application No. 109123323 dated Apr. 22, 2021 (six (6) pages).
(Continued)

*Primary Examiner* — Eliza W Osenbaugh-Stewart
(74) *Attorney, Agent, or Firm* — Crowell & Moring LLP

(57) ABSTRACT

An object of the present disclosure is to provide a charged particle beam device that can suppress an influence to a device generated according to the preliminary exhaust. In order to achieve the object, suggested is a charged particle beam device including a vacuum sample chamber that maintains an atmosphere around a sample to be irradiated with a charged particle beam in a vacuum state; and a preliminary exhaust chamber to which a vacuum pump for vacuuming an atmosphere of the sample introduced into the vacuum sample chamber is connected, in which the vacuum sample chamber is a box-shaped body including a top plate, and a portion between the top plate and a side wall of the box-shaped body positioned below the top plate includes a portion in which the top plate and the side wall are not in contact with each other.

15 Claims, 6 Drawing Sheets

(51) Int. Cl.
*H01J 37/28* (2006.01)
*H01J 37/22* (2006.01)
*H01J 37/20* (2006.01)
*H01J 37/147* (2006.01)

(52) U.S. Cl.
CPC ......... *H01J 37/20* (2013.01); *H01J 2237/166* (2013.01); *H01J 2237/184* (2013.01); *H01J 2237/1825* (2013.01); *H01J 2237/20292* (2013.01); *H01J 2237/24578* (2013.01)

(56) References Cited

U.S. PATENT DOCUMENTS

| | | | |
|---|---|---|---|
| 2004/0169832 A1* | 9/2004 | Shimoda | H01J 37/16 355/30 |
| 2004/0263819 A1* | 12/2004 | Yasumitsu | H01L 21/67126 355/67 |
| 2011/0098960 A1 | 4/2011 | Mizuochi | |
| 2013/0126750 A1 | 5/2013 | Enomoto et al. | |
| 2014/0042338 A1* | 2/2014 | Shibata | H01J 37/20 250/453.11 |
| 2015/0047785 A1 | 2/2015 | Kellogg et al. | |
| 2015/0311033 A1 | 10/2015 | Ominami et al. | |
| 2016/0086766 A1 | 3/2016 | Takahoko et al. | |
| 2016/0111246 A1 | 4/2016 | Matsumoto | |
| 2016/0240354 A1 | 8/2016 | Oba et al. | |
| 2018/0082819 A1 | 3/2018 | Ebine et al. | |
| 2020/0006031 A1* | 1/2020 | Izumi | H01J 37/153 |

FOREIGN PATENT DOCUMENTS

| | | |
|---|---|---|
| CN | 107430972 A | 12/2017 |
| JP | 2002-352760 A | 12/2002 |
| JP | 2004-134635 A | 4/2004 |
| JP | 2012-3892 A | 1/2012 |
| JP | 2014-35962 A | 2/2014 |
| JP | 2015-26462 A | 2/2015 |
| JP | 6198305 B2 | 9/2017 |
| JP | 6258801 B2 | 1/2018 |
| KR | 10-2011-0025785 A | 3/2011 |
| TW | 201621961 A | 6/2016 |
| TW | I659444 B | 5/2019 |
| TW | I663623 B | 6/2019 |

OTHER PUBLICATIONS

Korean-language Office Action issued in Korean Application No. 10-2020-0084493 dated Mar. 19, 2022 (six (6) pages).

* cited by examiner

[FIG. 2]
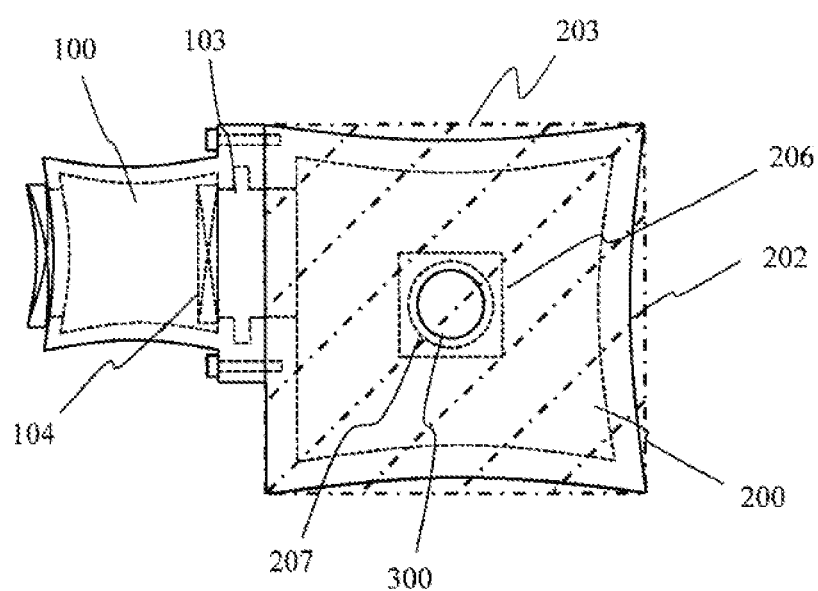
[FIG. 3]
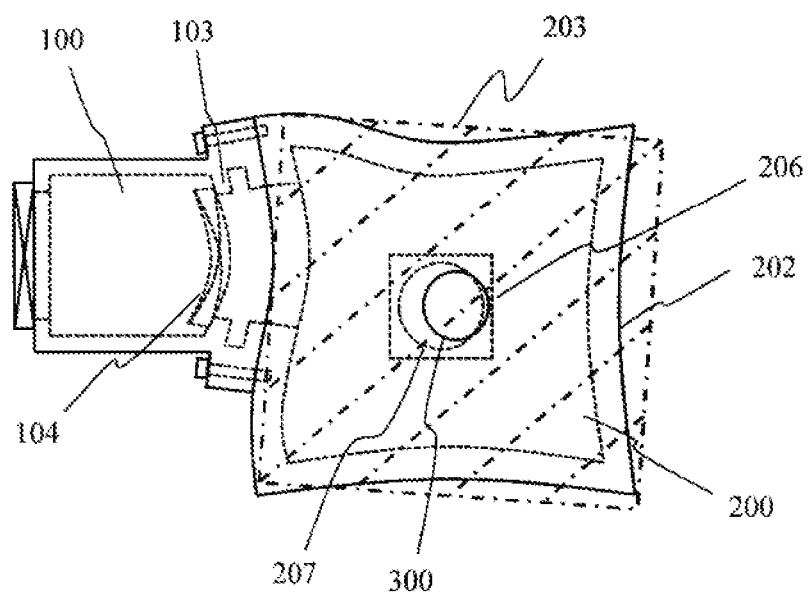

FIG. 4A
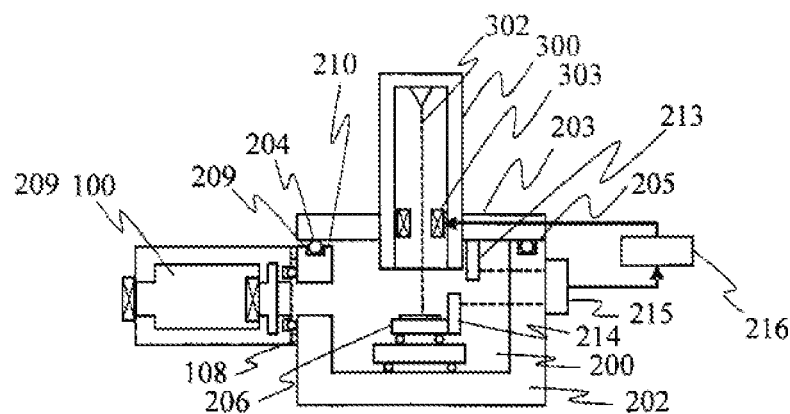
FIG. 4B
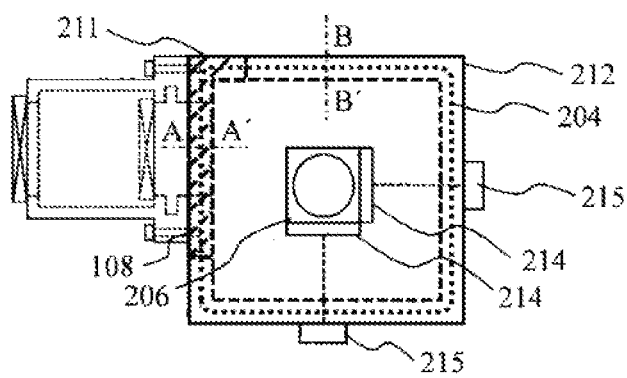
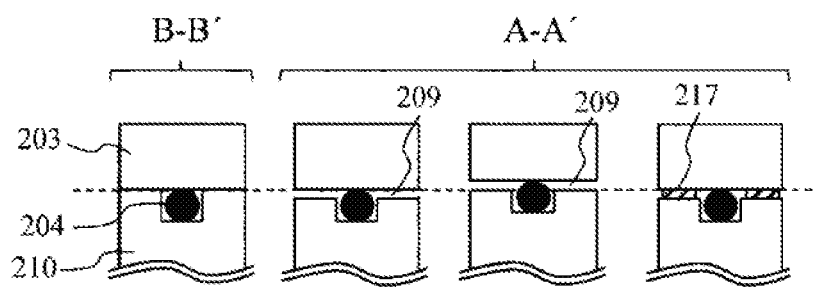
FIG. 4C   FIG. 4D   FIG. 4E   FIG. 4F

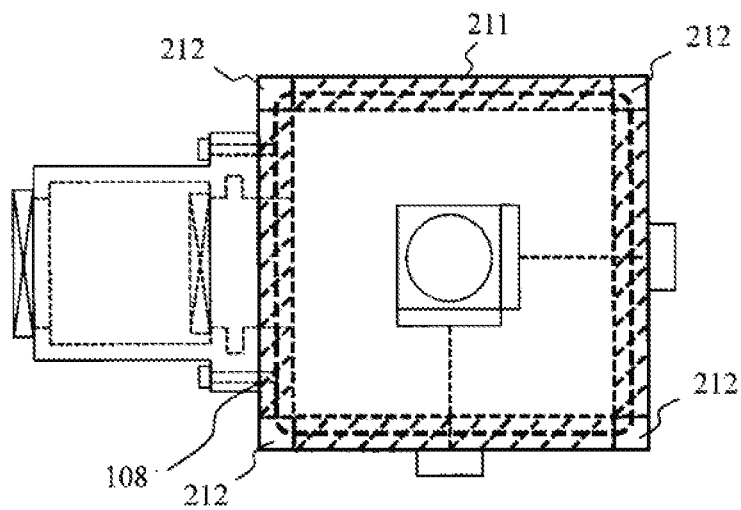
[FIG. 5]
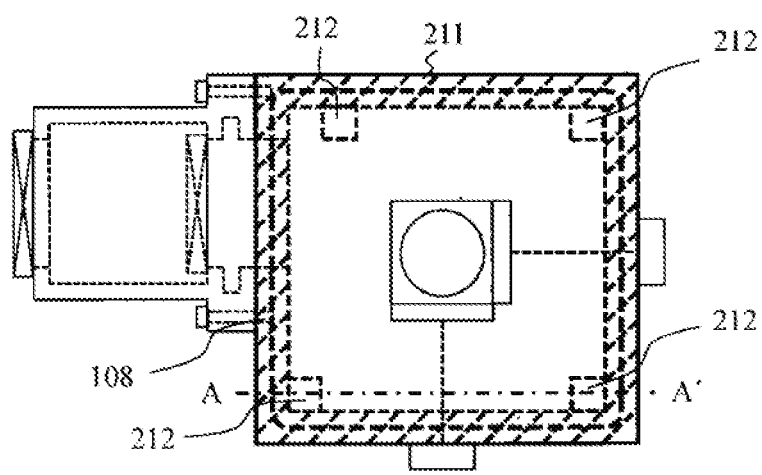
FIG. 6A
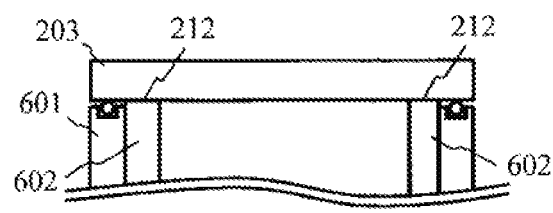
FIG. 6B

[FIG. 7]
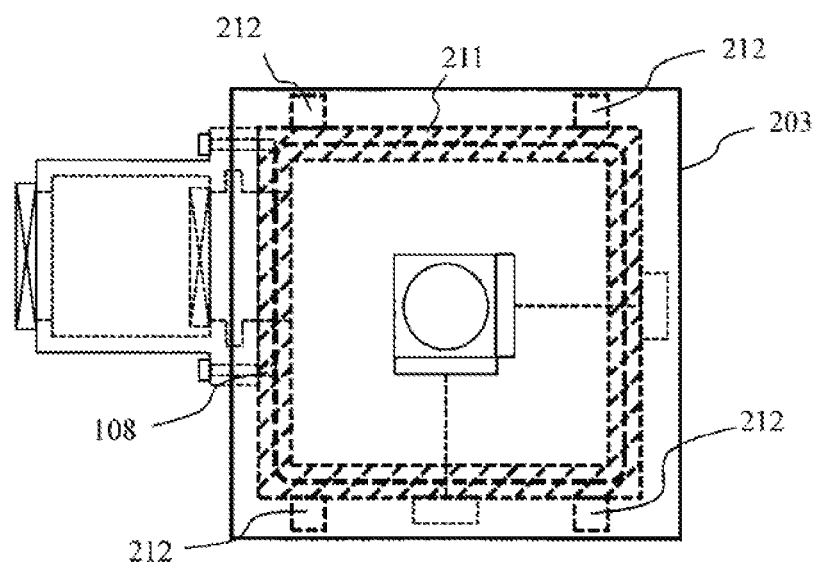
[FIG. 8]
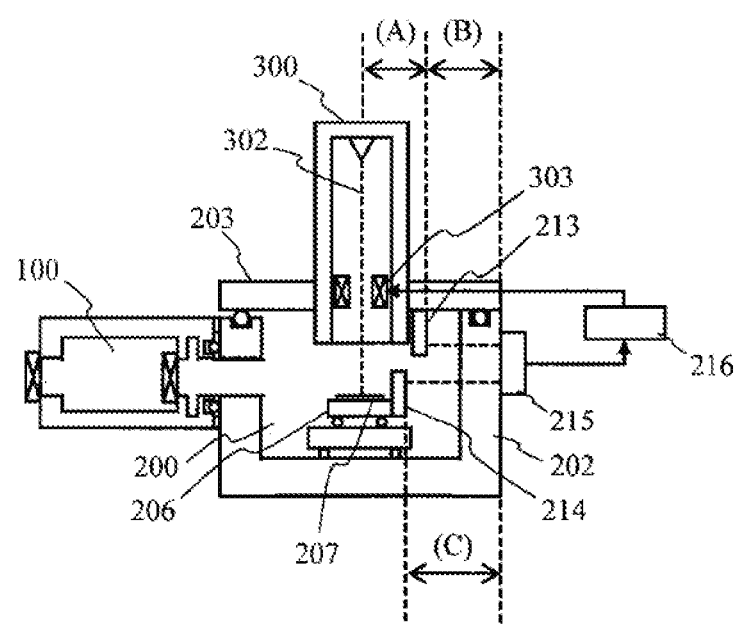

[FIG. 9]
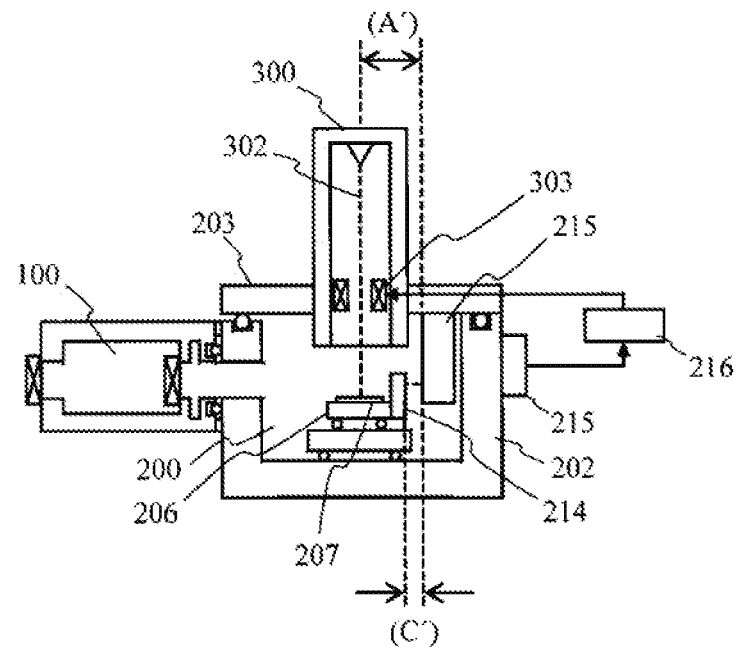
[FIG. 10]
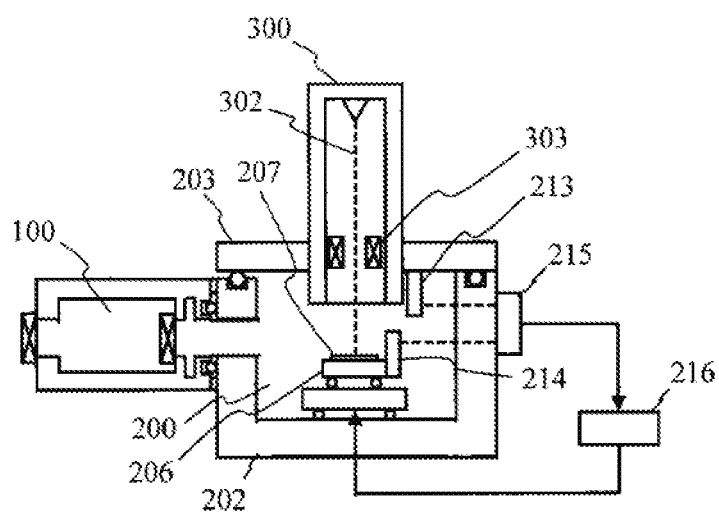

CHARGED PARTICLE BEAM DEVICE

TECHNICAL FIELD

The present disclosure relates to a charged particle beam device, and particularly to a charged particle beam device including a preliminary exhaust chamber that evacuates an atmosphere in which a sample is present before the sample is introduced into a vacuum sample chamber.

BACKGROUND ART

Some charged particle beam devices such as a scanning electron microscope are provided with a preliminary exhaust chamber. PTL discloses a charged particle beam device provided with a preliminary exhaust chamber. PTL 1 discloses a configuration in which a side wall surface of the preliminary exhaust chamber near a vacuum sample chamber is formed to a double-layer structure, and two side wall surfaces are separated from each other, in order to suppress the deformation of a connected surface between the vacuum sample chamber and the preliminary exhaust chamber by pressure changes in the preliminary exhaust chamber.

CITATION LIST

Patent Literature

PTL 1: JP-B-6198305

SUMMARY OF INVENTION

Technical Problem

PTL 1 discloses a method of reducing a force transmitted from the preliminary exhaust chamber to the sample chamber by pressure fluctuation of the preliminary exhaust chamber. It is configured to suppress the propagation of the deformation of the preliminary exhaust chamber to the vacuum sample chamber by separating a wall surface which is in contact with a valve of the preliminary exhaust chamber and a wall surface which is in contact with the vacuum sample chamber of the preliminary exhaust chamber. According to the structure, transmission of the force generated due to the deformation of the valve in the preliminary exhaust chamber to the sample chamber can be reduced, but a force transmitted from a fastening portion of the preliminary exhaust chamber and the sample chamber wall surface is not considered.

According to the research by the present inventors, it is confirmed that the force transmitted from the fastening portion deforms the side wall of the sample chamber and also transmitted to a top plate. Particularly, since the sample chamber wall surface near the preliminary exhaust chamber is required to be provided with an opening portion for conveying a sample (such as a wafer), rigidity thereof is lower than that of a portion without an opening, and it is likely to be deformed by a force transmitted from the preliminary exhaust chamber.

In this manner, it is confirmed by structural analysis, that, if the sample chamber top plate receives a force according to the pressure change of the preliminary exhaust chamber, deformation of the top plate and relative position deviation of the top plate with respect to the sample chamber occur.

Hereinafter, suggested is a charged particle beam device having an object of suppressing the deformation, the position deviation, or the like of the top plate due to the transmission of a force from the sample chamber side wall to the sample chamber top plate according to the pressure change of the preliminary exhaust chamber.

Solution to Problem

As an aspect to achieve the object, suggested is a charged particle beam device including a vacuum sample chamber that maintains an atmosphere around a sample to be irradiated with a charged particle beam in a vacuum state; and a preliminary exhaust chamber to which a vacuum pump for vacuuming an atmosphere of the sample introduced into the vacuum sample chamber is connected, in which the vacuum sample chamber is a box-shaped body including a top plate, and a portion between the top plate and a side wall of the box-shaped body positioned below the top plate includes a portion in which the top plate and the side wall are not in contact with each other.

Advantageous Effects of Invention

According to the configuration, the influence on the device which is generated according to the preliminary exhaust can be suppressed.

BRIEF DESCRIPTION OF DRAWINGS

FIG. 2 is a diagram illustrating a state in which a preliminary exhaust chamber and a sample chamber are deformed due to evacuation of the preliminary exhaust chamber.

FIG. 3 is a diagram illustrating a state in which the preliminary exhaust chamber and the sample chamber are deformed when the inside of the preliminary exhaust chamber is opened to the atmosphere.

FIGS. 4A to 4F are diagrams illustrating examples of the charged particle beam device provided with a portion in which a top plate and a side wall of the vacuum sample chamber are not in contact with each other.

FIG. 5 is a diagram illustrating an example of the charged particle beam device provided with a portion in which the top plate and the side wall of the vacuum sample chamber is not in contact with each other.

FIGS. 6A and 6B are diagrams illustrating an example of the charged particle beam device provided with the portion in which the top plate and the side wall of the vacuum sample chamber are not in contact with each other.

FIG. 7 is a diagram illustrating an example of the charged particle beam device provided with the portion in which the top plate and the side wall of the vacuum sample chamber are not in contact with each other.

FIG. 8 is a diagram illustrating an example of the charged particle beam device including a laser interferometer.

FIG. 9 is a diagram illustrating an example of the charged particle beam device including the laser interferometer.

FIG. 10 is a diagram illustrating an example of the charged particle beam device including the laser interferometer.

DESCRIPTION OF EMBODIMENTS

Figure 1A:
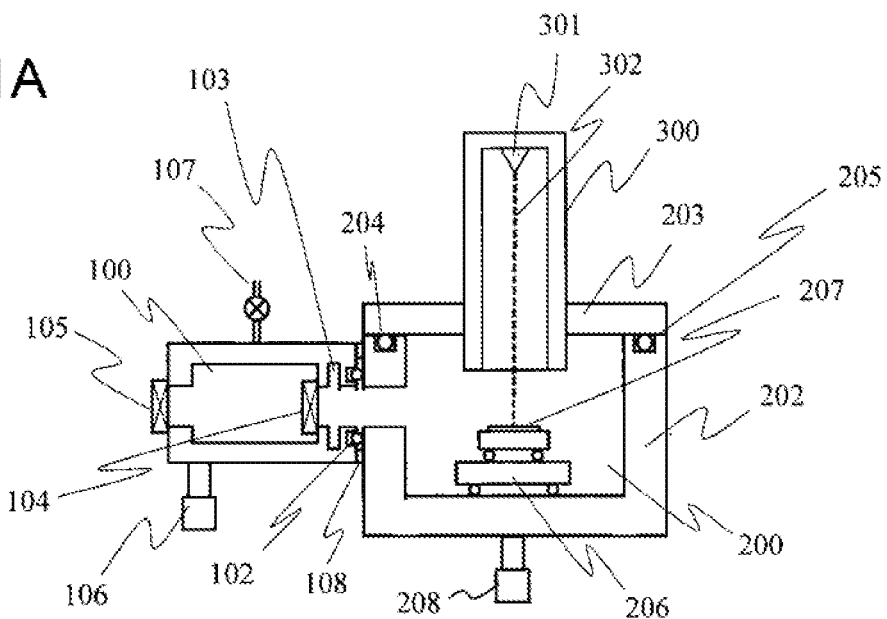
FIGS. 1A and 1B are diagrams illustrating an example of a charged particle beam device.

An example described below relates to a charged particle beam device in which an influence on the device is reduced mainly based on a pressure change of a preliminary exhaust chamber. A charged particle beam device that can reduce a relative shift of a charged particle beam with respect to a sample by correcting a displacement of a top plate according to the pressure change of the preliminary exhaust chamber is described.

Since a charged particle beam device represented by a scanning electron microscope used in inspection and measurement of a semiconductor requires a high resolution, charged particle beam irradiation in a high vacuum is required. The charged particle beam device is provided with a preliminary exhaust chamber, and in a state in which a high vacuum state of the vacuum sample chamber is maintained, a sample can be exchanged between the preliminary exhaust chamber and the vacuum sample chamber. If the preliminary exhaust chamber is provided, the sample can be replaced without breaking the vacuum of the vacuum sample chamber, and thus a high throughput of the device can be realized.

Meanwhile, in the preliminary exhaust chamber, evacuation and air introduction are repeated every time a sample is exchanged, and at this point, the pressure difference with the outside changes. Therefore, the upper surface, the lower surface, or the side surface of the preliminary exhaust chamber are deformed.

Main components of the charged particle beam device such as a scanning electron microscope are a preliminary exhaust chamber, a sample chamber, and a lens barrel including an electron optical system. The preliminary exhaust chamber and the sample chamber are provided with opening portions for conveying a sample, and side surfaces having the opening portions are connected to each other. When the sample in the atmosphere is loaded, since the preliminary exhaust chamber is once in the atmospheric state, the connection surface between the preliminary exhaust chamber and the sample chamber is deformed toward the sample chamber due to the pressure difference from the sample chamber. It is likely to change the position of the lens barrel by transmitting the deformation of the side wall of the box-shaped body near the preliminary exhaust chamber generated due to this deformation, to the top plate. If this deformation or the like occurs during the observation, the irradiation position of the charged particle beam changes, and thus the observation image shifts. While the image shifts, the observation with high accuracy becomes difficult. It is conceivable not to perform measurements, inspections, or the like based on the irradiation with the charged particle beam, while the evacuation or air introduction is performed, but a throughput of the device decreases due to the increase in the standby time.

Hereinafter, described is a charged particle beam device including a sample chamber that maintains a space surrounding a sample irradiated with a charged particle beam in a vacuum state, and a preliminary exhaust chamber that evacuates a space surrounding the sample introduced into the sample chamber, in which a first portion in which metal surfaces of a back surface of a top plate of the sample chamber and a side wall of the box-shaped body are in contact with each other, and a second portion in which at least metal surfaces of the top plate and the side wall arranged near the preliminary exhaust chamber are not in contact with each other are provided between the top plate of the sample chamber and the side wall of the sample chamber. A vacuum sealing material that seals a portion between the top plate and the side wall is provided. A measurement reference plane provided on the top plate, a mirror provided on the stage, and a laser interferometer provided on the box-shaped body may be provided.

According to the configuration, the deformation of the preliminary exhaust chamber according to the pressure change is transmitted to the side wall of the sample chamber, but the deformation of the side wall is not transmitted to the top plate by the gap between the side wall and the top plate, the deformation of the sample chamber can be suppressed, and thus the shift of the charged particle beam can be suppressed.

For example, by estimating the deformation of the side wall by structure analysis in advance and setting the dimension of the gap to be slightly larger than the estimated value, the vacuum state in the sample chamber can be maintained by the vacuum sealing material while the contact between metal surfaces when the side wall and the top plate are deformed is prevented to suppress the transmission of the force. By measuring the displacement of the top plate with the laser interferometer and feeding back the shift amount of the charged particle beam or the stage position, the relative displacement between the charged particle beam and the sample which occurs according to the displacement of the top plate can be highly accurately corrected. Since the accuracy of the correction more improves, as the deformation of the top plate is smaller, a greater effect can be obtained by using a combination with the method of suppressing the deformation of the top plate.

The example described below relates to a charged particle beam device including a preliminary exhaust chamber and relates to a charged particle beam device that performs beam irradiation at a correct position regardless of the deformation of the preliminary exhaust chamber. As an example, described is a charged particle beam device including a sample chamber which is constantly in a vacuum state, a preliminary exhaust chamber in which a vacuum state and the atmospheric state can be exchanged, and a lens barrel having an optical system, in which a portion not having a metal contact in a gap between the top plate and the side wall of the sample chamber except for a vacuum sealing material is provided, so that the deformation of the top plate is suppressed by the pressure change of the preliminary exhaust chamber, and the shift of the image is reduced by correcting the displacement of the top plate.

According to the above structure, according to the pressure fluctuation of the preliminary exhaust chamber, the deformation of the top plate is suppressed, and also the influence on the displacement of the top plate can be corrected. Accordingly, the shift of the image is reduced and the standby time is shortened, so that the improvement on a throughput of the device can be realized. Hereinafter, the charged particle beam device including the preliminary exhaust chamber is specifically described together with other embodiments with reference to the drawings.

Figure 1B:
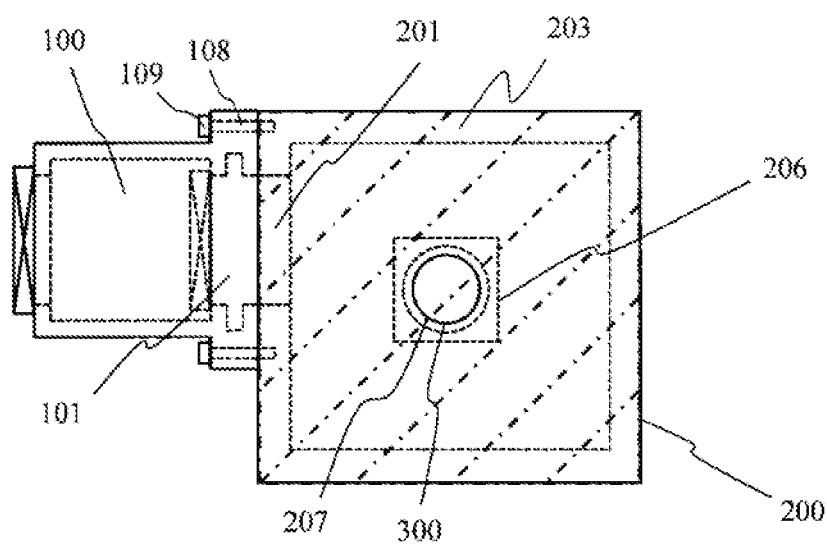

FIGS. 1A and 1B are diagrams illustrating an outline of a charged particle beam device, FIG. 1A is a side sectional view, and FIG. 1B is a top view of the charged particle beam device as viewed from a beam column direction. As shown in FIG. 1A, the present device includes a preliminary exhaust chamber 100, a sample chamber 200, and a lens barrel 300 (beam column). The sample chamber 200 maintains a space surrounding a sample irradiated with a charged particle beam 302 in a vacuum state, and the preliminary exhaust chamber 100 evacuates a space surrounding a sample introduced into the sample chamber 200.

Hereinafter, specific configurations of the preliminary exhaust chamber 100 and the sample chamber 200 are described. The preliminary exhaust chamber 100 and the sample chamber 200 are fixed to each other in fastening portions 108 by bolts 109 with sample transfer ports 101 and 201 facing each other as illustrated in FIG. 1B, and are sealed with vacuum sealing materials 102. The sample chamber 200 is configured with a box-shaped body 202 and a top plate 203, a space therebetween is sealed with a vacuum sealing material 204, and metal surfaces thereof are in contact with each other on a contact surface 205. The vacuum sealing material 204 is, for example, an O-ring used for vacuum sealing.

The preliminary exhaust chamber 100 is provided with valves 104 and 105. The valve 104 maintains the vacuum of the sample chamber 200, even if the preliminary exhaust chamber 100 is in the atmospheric state. The valve 105 enables a sample 207 to be loaded into or unloaded from the preliminary exhaust chamber 100. The preliminary exhaust chamber 100 is evacuated by a vacuum pump 106, and released to the atmosphere by a leak valve 107. The sample chamber 200 is constantly evacuated by a vacuum pump 208. This configuration simultaneously enables the observation in the sample chamber 200 and the loading or unloading of the sample 207 into and from the preliminary exhaust chamber 100.

When the pressure in the preliminary exhaust chamber 100 changes during observation, the preliminary exhaust chamber 100 and the sample chamber 200 are deformed as illustrated in FIGS. 2 to 3. Here, the deformation of the valve 104 is absorbed by slits 103, but when the slits 103 receive a force, the preliminary exhaust chamber 100 is deformed, and the box-shaped body 202 is deformed via the fastening portions 108. Here, when a side wall 210 and the surface of the top plate 203 of the box-shaped body 202 are in metal contact with each other, the deformation of the box-shaped body 202 is transmitted to the top plate 203 by the frictional force of the metal contact portion, and the top plate 203 is deformed and relatively displaced with respect to the sample 207. If the deformation and displacement occur during the observation, the posture and the position of the lens barrel 300 change, the irradiation position of the charged particle beam 302 fluctuates, and an image shifts.

Hereinafter, a specific example of the charged particle beam device that can suppress a beam shift is described. FIG. 4A is a diagram illustrating an example in which a feedback system for suppressing the deformation of the top plate 203 caused by the deformation of the preliminary exhaust chamber 100 and correcting the displacement of the top plate is provided. In this example, the side wall 210 is slightly cut to form a gap 209 (a portion in which the top plate 203 and the side wall 210 are not in contact with each other) between the side wall 210 and the top plate 203. In order to correct the displacement of the top plate 203, a system for measuring a relative displacement between a measurement reference plane 213 provided on the top plate 203 and mirrors 214 provided on a stage 206 by a laser interferometer 215, feeding back to a deflector 303 by a controller 216, and controlling the charged particle beam 302 is provided. Other configurations are the same as the device configuration described with reference to FIGS. 1A and 1B.

If the gap 209 is provided, even if the box-shaped body 202 is deformed due to the deformation of the preliminary exhaust chamber 100, the deformation is not transmitted to the top plate 203. By separating the box-shaped body 202 and the top plate 203, the propagation of the influence of the deformation from the side wall of the box-shaped body 202 can be suppressed. Here, the box-shaped body 202 and the top plate 203 are in contact with each other with the vacuum sealing material 204 interposed therebetween. However, since the rigidity of vacuum sealing material is lower than that of other components, the force can be absorbed by the deformation of the vacuum sealing material. This structure suppresses the deformation of the top plate 203, and enables the reduction of the image shift.

FIG. 4B is a top view of the charged particle beam device as viewed in the irradiation direction of the charged particle beam, and is a diagram illustrating an example of an area of the gap provided between the box-shaped body and the top plate. As illustrated in FIG. 4B, a cut area 211 (the area shaded by oblique lines in the figure) includes an upper surface of the box-shaped body 202 on the side where at least, the preliminary exhaust chamber 100 is mounted. In other words, a contactless area of the top plate 203 and the box-shaped body 202 is provided on a portion near the top plate 203 which is a side wall of the box-shaped body 202 near the preliminary exhaust chamber 100 and which is in contact with at least the preliminary exhaust chamber is provided.

However, if the cut area 211 is too large, the top plate 203 is deformed toward the box-shaped body 202 due to the weight of the top plate 203 and the pressure difference between the inside and the outside of the sample chamber 200, and the top plate 203 and the box-shaped body 202 come into contact with each other. Therefore, a non-cut area 212 is arranged to an extent that no contact occurs. That is, by the configuration of supporting the load of the top plate 203 with the non-cut area 212 (contact area), the contactless state of the cut area 211 is maintained.

FIGS. 4C to 4F are cross-sectional views of a portion in which the side wall 210 and the top plate 203 are close to each other. FIG. 4C is a diagram illustrating a cross section taken along the line B-B' of FIG. 4B and illustrates a state in which the side wall 210 of the box-shaped body 202 and the lower surface of the top plate 203 are in contact with each other. The side wall 210 and the top plate 203 are formed of metal and are in a state where the metals are in contact with each other.

FIGS. 4D to 4F are diagrams illustrating various examples of the cross section taken along the line A-A' of FIG. 4B. FIG. 4D is a diagram illustrating an example in which the gap 209 is provided by cutting the upper surface of the side wall of the box-shaped body 202 (or forming the upper surface to be lower than the contact area). FIG. 4E is a diagram illustrating an example in which the gap 209 is provided by cutting the lower surface of the top plate 203. FIG. 4F illustrates an example in which an attenuating material 217 configured with, for example, a viscoelastic member is inserted into a gap formed by cutting the upper surface of the side wall of the box-shaped body 202. By interposing the attenuating material 217 for suppressing the propagation of vibration in the gap (contactless portion), the vibration characteristics can be improved while the same rigidity as low as that in the contactless state is maintained. As a result, the transmission of the influence of the deformation on the top plate can be suppressed.

As described above, by providing a gap at least between a portion of the side wall with which the preliminary exhaust chamber is in contact and the top plate as viewed from the irradiation direction (z direction) of the charged particle beam, the propagation of the influence of the fluctuation to the top plate can be suppressed. With respect to the contactless portion, the vacuum sealing material 204 is arranged to be in contact with the both of the side wall 210 of the box-shaped body 202 and the lower surface of the top plate 203 so that the upper surface of the side wall of the box-shaped body 202 and the lower surface of the top plate 203 are not in contact with each other, and the vacuum inside the sample chamber 200 is maintained.

As described above, it is satisfactory if the top plate is supported while a gap is provided between the portion of the side wall in contact with at least the preliminary exhaust chamber and the top plate as viewed from the irradiation direction of the charged particle beam, so the configuration as illustrated in FIG. 5 can be used. In the example of FIG. 5, the cut areas 211 are provided on four sides of the rectangular box-shaped body 202, and the non-cut areas 212 are provided on four corners of the box-shaped body 202, so the above conditions are satisfied. In the example of FIG. 5, the top plate 203 is supported by the columns provided at the four corners of the box-shaped body 202.

As exemplified in FIG. 6A, the contact areas (the non-cut areas 212) may be prepared by forming the cut area 211 (shaded area) on the entire upper surface of the box-shaped body 202 and providing separate supporting members inside the box-shaped body 202. FIG. 6B is a cross-sectional view taken along the line A-A' of FIG. 6A, and illustrates an example in which columnar bodies 602 are provided inside a side wall 601 of the box-shaped body 202 to provide the contact areas 212 with the top plate 203. By providing the columnar bodies 602 so that the contact areas 212 are at positions higher than the upper surface of the side wall 601, the influence of shape change of the preliminary exhaust chamber on the top plate 203 can be suppressed.

FIG. 7 illustrates an example in which the contact areas 212 are formed on the outside (atmosphere side) of the box-shaped body 202, and the top plate 203 is supported by the contact areas 212. In a case of the example of FIG. 7, for example, columnar bodies are mounted on the external wall of the box-shaped body 202, and the top plate 203 is supported by the contact areas 212 on the columnar bodies. In this manner, if the supporting members are provided on at least one of the inside or the outside of the box-shaped body 202, the cut area 211 can be provided, and the top plate 203 can be supported.

The supporting member may be provided, for example, by fixing the columnar bodies to the side wall of the box-shaped body 202 or fixing the columnar bodies to the bottom inside the box-shaped body.

FIGS. 8 to 10 are drawings illustrating configurations of the feedback system using the laser interferometer. As illustrated in FIG. 8, a distance (B) between the laser interferometer 215 and the measurement reference plane 213 and a distance (C) between the laser interferometer 215 and the mirror 214 are respectively measured by the laser interferometer 215 mounted on the box-shaped body 202 by providing the measurement reference plane 213 on the top plate 203 and the mirrors 214 on the stage 206. If the difference between the distance (B) and the distance (C) changes when the preliminary exhaust chamber 100 is evacuated or opened to the atmosphere, the change amount of the difference of these distances is input to the controller 216 (control device) to control the input to the deflector 303, to shift the charged particle beam 302 in the direction of cancelling the changes of the distance.

Accordingly, even if the top plate 203 is relatively displaced with respect to the box-shaped body 202 or the sample 207, the shift of the observation image can be suppressed. This correction method is effective when a change of a distance (A) between the axis of the charged particle beam and the measurement reference plane 213 is negligible. If the distance (A) changes by the deformation of the top plate, a measurement error is included, and the correction accuracy decreases. Accordingly, in order to reduce the influence of the change of the distance (A) as much as possible, it is desirable that the measurement reference plane 213 is arranged at a position close to the lens barrel 300 as much as possible.

As illustrated in FIG. 8, this correction method can be applied to a plurality of axes. FIG. 8 illustrates an example in which correction is performed respectively to two different axes. Specifically, the correction is performed respectively to an optical axis directing from the laser interferometer 215 to the measurement reference plane 213 provided on the top plate 203 and an optical axis directing to the mirror 214.

Subsequently, as illustrated in FIG. 9, the laser interferometer 215 may be mounted directly on the top plate 203 to measure a distance (C') to the mirror 214 provided on the stage 206. In this case, the change amount of the distance (C') is input to the controller 216. Also, in this configuration, in order to reduce the influence of the change of a distance (A') between the axis of the charged particle beam and the laser interferometer, the laser interferometer 215 is desirably arranged to a position closest to the lens barrel 300 as much as possible.

As illustrated in FIG. 10, the feedback destination of the change of the distance obtained by the laser interferometer 215 may be set as the stage. In this case, the position of the stage 206 is changed to a direction of cancelling the change of the distance by controlling an input to an actuator of the stage 206.

As described above, since the fluctuation in the measurement reference of the laser interferometer provided on the top plate or the position of the laser interferometer can be suppressed by forming the top plate and the side wall of the sample chamber near the preliminary exhaust chamber to a contactless structure, the stage position measurement accuracy can be improved.

REFERENCE SIGNS LIST

100: preliminary exhaust chamber
101: sample transfer port
102: vacuum sealing material
103: slit
104: valve
105: valve
106: vacuum pump
107: leak valve
108: fastening portion
109: bolt
200: sample chamber
201: sample transfer port
202: box-shaped body
203: top plate
204: vacuum sealing material
205: contact surface
206: stage
207: sample
208: vacuum pump
209: gap
210: side wall
211: cut area
212: non-cut area
213: measurement reference plane
214: mirror
215: laser interferometer
216: controller
217: attenuating material
300: lens barrel
301: filament
302: charged particle beam
303: deflector

The invention claimed is:

1. A charged particle beam device comprising:
a vacuum sample chamber that maintains an atmosphere around a sample to be irradiated with a charged particle beam in a vacuum state; and
a preliminary exhaust chamber to which a vacuum pump for vacuuming an atmosphere of the sample introduced into the vacuum sample chamber is connected,
wherein the vacuum sample chamber is a box-shaped body including a top plate, and
a portion between the top plate and a side wall of the box-shaped body positioned below the top plate includes a portion in which the top plate and the side wall are not in contact with each other.

2. The charged particle beam device according to claim 1, wherein the portion between the top plate and the side wall includes a portion in which the top plate and the side wall are in contact with each other, and
the top plate is supported by the contact portion with the side wall.

3. The charged particle beam device according to claim 2, wherein the contactless portion is provided on the side wall to which the preliminary exhaust chamber is connected.

4. The charged particle beam device according to claim 3, wherein the contactless portion is formed on the side wall near the top plate to which the preliminary exhaust chamber is connected, as viewed from an optical axis direction of the charged particle beam.

5. The charged particle beam device according to claim 1, wherein a vacuum sealing material is arranged between the top plate and the side wall to be in contact with the top plate and the side wall.

6. The charged particle beam device according to claim 5, wherein the vacuum sealing material is an O-ring.

7. The charged particle beam device according to claim 5, wherein an attenuating material is arranged in the contactless portion to be in contact with the top plate and the side wall.

8. The charged particle beam device according to claim 1, wherein a supporting member that supports the top plate is provided on at least one of an inside and an outside of the box-shaped body.

9. The charged particle beam device according to claim 1, further comprising:
a measurement reference provided on the top plate;
a stage on which the sample arranged in the vacuum sample chamber and to be irradiated with the charged particle beam is placed;
a mirror provided on the stage;
a laser interferometer that irradiates the measurement reference and the mirror with laser; and
a control device that controls a position of the stage according to a change of a difference between a distance between the measurement reference and the laser interferometer and a distance between the mirror and the laser interferometer, which is obtained based on the irradiation of the measurement reference and the mirror with laser.

10. The charged particle beam device according to claim 1, further comprising:
a deflector that deflects an irradiation position with the charged particle beam applied to the sample;
a measurement reference provided with the top plate;
a stage on which the sample arranged in the vacuum sample chamber and to be irradiated with the charged particle beam is placed;
a mirror provided on the stage;
a laser interferometer that irradiates the measurement reference and the mirror with laser; and
a control device that controls the deflector so that the irradiation position with the charged particle beam is deflected according to a change of a difference between a distance between the measurement reference and the laser interferometer and a distance between the mirror and the laser interferometer, which is obtained based on the irradiation of the measurement reference and the mirror with laser.

11. The charged particle beam device according to claim 1, further comprising:
a laser interferometer that is provided on the top plate;
a stage on which the sample arranged in the vacuum sample chamber and to be irradiated with the charged particle beam is placed;
a mirror that is provided on the stage and irradiated with laser of the laser interferometer; and
a control device that controls a position of the stage according to a distance between the laser interferometer and the mirror which is obtained based on the irradiation of the mirror by the laser interferometer with laser.

12. The charged particle beam device according to claim 1, further comprising:
a deflector that deflects an irradiation position with the charged particle beam applied to the sample;
a laser interferometer that is provided on the top plate;
a stage on which the sample arranged in the vacuum sample chamber and to be irradiated with the charged particle beam is placed;
a mirror that is provided on the stage and irradiated with laser of the laser interferometer; and
a control device that controls the deflector so that the irradiation position with the charged particle beam is deflected according to a distance between the laser interferometer and the mirror which is obtained based on the irradiation of the mirror by the laser interferometer with the laser.

13. A charged particle beam device according to claim 1, wherein the portion in which the top plate and the side wall are not in contact with each other is formed so as to include a region directly above a fastening portion between the vacuum sample chamber and the preliminary exhaust chamber.

14. A charged particle beam device according to claim 1, wherein the portion in which the top plate and the side wall are not in contact with each other is formed so as to include a region directly above a fastening portion between the vacuum sample chamber and the box-shaped body.

15. A charged particle beam device according to claim 1, wherein the portion in which the top plate and the side wall are not in contact with each other is formed so as to include a region directly above a fastening portion between the vacuum sample chamber and the side wall.

* * * * *